United States Patent
Takeda et al.

(10) Patent No.: US 11,618,954 B2
(45) Date of Patent: Apr. 4, 2023

(54) DRY ETCHING METHOD, METHOD FOR MANUFACTURING SEMICONDUCTOR DEVICE, AND ETCHING DEVICE

(71) Applicant: CENTRAL GLASS COMPANY, LIMITED, Yamaguchi (JP)

(72) Inventors: Yuuta Takeda, Yamaguchi (JP); Kunihiro Yamauchi, Yamaguchi (JP); Akifumi Yao, Yamaguchi (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 0 days.

(21) Appl. No.: 17/434,898

(22) PCT Filed: Feb. 19, 2020

(86) PCT No.: PCT/JP2020/006500
§ 371 (c)(1),
(2) Date: Aug. 30, 2021

(87) PCT Pub. No.: WO2020/179449
PCT Pub. Date: Sep. 10, 2020

(65) Prior Publication Data
US 2022/0056593 A1    Feb. 24, 2022

(30) Foreign Application Priority Data

Mar. 1, 2019  (JP) .............................. JP2019-037591

(51) Int. Cl.
*C23F 4/00* (2006.01)
*C23F 1/12* (2006.01)
(Continued)

(52) U.S. Cl.
CPC .................. *C23F 4/00* (2013.01); *C23F 1/00* (2013.01); *C23F 1/12* (2013.01);
(Continued)

(58) Field of Classification Search
None
See application file for complete search history.

(56) References Cited

U.S. PATENT DOCUMENTS

| | | |
|---|---|---|
| 2005/0142885 A1 | 6/2005 | Shinriki |
| 2014/0352716 A1 | 12/2014 | Kikuchi et al. |
| 2015/0047680 A1 | 2/2015 | Umezaki et al. |

(Continued)

FOREIGN PATENT DOCUMENTS

| | | |
|---|---|---|
| EP | 0 964 439 | 12/1999 |
| JP | 2004-91829 | 3/2004 |

(Continued)

OTHER PUBLICATIONS

International Search Report dated Apr. 21, 2020 in corresponding International (PCT) Patent Application No. PCT/JP2020/006500.

(Continued)

*Primary Examiner* — Jiong-Ping Lu
(74) *Attorney, Agent, or Firm* — Wenderoth, Lind & Ponack, L.L.P.

(57) ABSTRACT

The dry etching method of the present invention etches a metal film formed on a surface of a workpiece by bringing etching gases each containing a β-diketone into contact with the metal film. The method includes: a first etching step of bringing a first etching gas containing a first β-diketone into contact with the metal film; and a second etching step of bringing a second etching gas containing a second β-diketone into contact with the metal film after the first etching step. The first β-diketone is a compound capable of forming a first complex through a reaction with the metal film. The second β-diketone is a compound capable of forming a second complex having a lower sublimation point than the first complex through a reaction with the metal film.

12 Claims, 3 Drawing Sheets

(51) Int. Cl.
  *H01L 21/302*     (2006.01)
  *H01L 21/3213*    (2006.01)
  *H01L 21/311*     (2006.01)
  *C23F 1/00*       (2006.01)
  *H01L 21/02*      (2006.01)

(52) U.S. Cl.
  CPC ...... *H01L 21/02312* (2013.01); *H01L 21/302* (2013.01); *H01L 21/31111* (2013.01); *H01L 21/3213* (2013.01)

(56) References Cited

U.S. PATENT DOCUMENTS

| | | |
|---|---|---|
| 2018/0076087 A1 | 3/2018 | Yamauchi et al. |
| 2020/0066541 A1 | 2/2020 | Yamauchi et al. |

FOREIGN PATENT DOCUMENTS

| | | | | |
|---|---|---|---|---|
| JP | 2013-194307 | | 9/2013 | |
| JP | 2014-236096 | | 12/2014 | |
| JP | 2018-110229 | | 7/2018 | |
| WO | 2017/134930 | | 8/2017 | |
| WO | WO2017134930 | * | 8/2017 | ........... H01L 23/532 |

OTHER PUBLICATIONS

Umezaki et al., "Thermal dry-etching of nickel using oxygen and 1,1,1,5,5,5-hexfluoro-2,4-pentandeione (Hhfac)", Proceedings of the 16$^{th}$ International Conference on Nanotechnology, Sendai, Japan, IEEE, 2016, pp. 135-138, 4 pages.

* cited by examiner

DRY ETCHING METHOD, METHOD FOR MANUFACTURING SEMICONDUCTOR DEVICE, AND ETCHING DEVICE

TECHNICAL FIELD

The present disclosure relates to dry etching methods, methods of producing a semiconductor device, and etching devices.

BACKGROUND ART

The process of producing a semiconductor device sometimes incudes etching a metal film formed on a substrate as a conductive line material, a metal gate material, an electrode material, or a magnetic material.

Miniaturization of semiconductor devices has led to the demand for a high level of control in such etching of a metal film so as to form a fine pattern through the etching. Specifically, consideration has been given to, for example, etching a metal film such that the etching amount variation on a surface of a wafer is 1 nm or less, controlling the roughness of the surface of a metal film after etching, and selectively etching a metal film. Such a high level of control in etching is difficult to achieve by wet etching which etches a metal film with a chemical. Thus, dry etching which etches a metal film with a gas has been considered.

Patent Literature 1 discloses an etching method including an etching step of etching a thin film formed on a substrate at a substrate temperature of 300° C.; or higher, preferably 450° C.; or higher, with an etching gas containing a β-diketone and at least one of water or an alcohol to expose the surface of the substrate. Patent Literature 2 discloses a method of etching a metal film through formation of a complex of a β-diketone with a metal by use of an etching gas containing a β-diketone and 1 to 20% by volume of water or hydrogen peroxide in a temperature range of 100° C.; or higher and 350° C.; or lower. Patent Literature 2 states that the metal film may be formed of a metal such as zinc, cobalt, hafnium, iron, manganese, or vanadium. According to Patent Literature 2, incorporating water or hydrogen peroxide into the etching gas increases the etching rate of the metal film as compared to the case of incorporating oxygen into the etching gas.

Aside from such a method of etching a metal film on a substrate to form a fine pattern, a method using a β-diketone is suggested as a method of dry cleaning a metal film adhering to the inside of a film forming device used in the process of producing a semiconductor device.

Patent Literature 3 discloses a dry cleaning method for removing a metal film adhering to a film forming device by reacting a cleaning gas containing a β-diketone and NOx (one of NO and $N_2O$) with the metal film within a temperature range of 200° C. to 400° C., preferably 250° C. to 370° C. Patent Literature 3 states that the metal film may be formed of a metal such as nickel, manganese, iron, or cobalt. According to Patent Literature 3, use of NOx widens the temperature range in which the metal film can be removed by etching as compared to use of oxygen.

CITATION LIST

Patent Literature

Patent Literature 1: JP 2004-91829 A
Patent Literature 2: JP 2014-236096 A
Patent Literature 3: JP 2013-194307 A

SUMMARY OF INVENTION

Technical Problem

Most metal films to be etched are polycrystalline films formed through aggregation of crystal grains, although the crystallinity thereof differs depending on the film formation method used. Such a metal film is very difficult to etch entirely evenly by the method of any one of Patent Literatures 1 to 3. Usually, since crystal grain boundaries where the bonding is relatively weak (i.e., the reactivity is high) are preferentially etched, the film after the etching seemingly has a rough surface due to the different etching rates. Even slight roughness of the surface cannot be disregarded since formation of a finer pattern by etching has been required, and thus such roughness is desired to be eliminated.

In etching of a metal film with an etching gas containing a β-diketone, the metal film is etched through formation of a complex of the metal and the β-diketone. Since the formation of a complex requires oxidation of the metal, an oxidant such as oxygen or the NOx described above is often added to the etching gas. Although the present inventors have reduced surface roughness by controlling the conditions such as the amount of the oxidant, the timing to add the oxidant, and the conditions of the processing using a β-diketone, these measures have not solved the problem at a fundamental level.

The present disclosure was made in view of the above problem and aims to provide a dry etching method capable of reducing or preventing surface roughness of a metal film. The present disclosure also aims to provide a method of producing a semiconductor device by the dry etching method. Furthermore, the present disclosure aims to provide an etching device capable of reducing or preventing surface roughness of a metal film.

Solution to Problem

The present inventors focused on the significantly different sublimation points of complexes formed by the reactions between a metal and different β-diketones. The inventors then found that when a metal film is processed with a first β-diketone forming a first complex that has a high sublimation point and then with a second β-diketone forming a second complex that has a lower sublimation point than the first complex, the surface roughness of the metal film is reduced. Thereby, the inventors arrived at the present disclosure.

The dry etching method of the present disclosure etches a metal film formed on a surface of a workpiece by bringing etching gases each containing a β-diketone into contact with the metal film, the method including: a first etching step of bringing a first etching gas containing a first β-diketone into contact with the metal film; and a second etching step of bringing a second etching gas containing a second β-diketone into contact with the metal film after the first etching step, the first β-diketone being a compound capable of forming a first complex through a reaction with the metal film, the second β-diketone being a compound capable of forming a second complex having a lower sublimation point than the first complex through a reaction with the metal film.

In the dry etching method of the present disclosure, preferably, a combination of the first β-diketone and the second β-diketone (first β-diketone, second β-diketone) is (acetylacetone, hexafluoroacetylacetone), (acetylacetone, trifluoroacetylacetone), or (trifluoroacetylacetone, hexafluoroacetylacetone).

In the dry etching method of the present disclosure, the first etching step and the second etching step may be repeated.

In the dry etching method of the present disclosure, preferably, the metal film contains at least one metallic element selected from the group consisting of Zr, Hf, Fe, Mn, Cr, Al, Ru, Co, Cu, Zn, Pt, and Ni.

In the dry etching method of the present disclosure, preferably, the first etching gas and the second etching gas each independently further contain at least one additive gas selected from the group consisting of NO, $NO_2$, $N_2O$, $O_2$, $O_3$, $H_2O$, and $H_2O_2$.

In the dry etching method of the present disclosure, preferably, the metal film contains a cobalt element, the first etching gas contains acetylacetone as the first β, diketone and NO as an additive gas, and the second etching gas contains hexafluoroacetylacetone as the second β-diketone and NO as an additive gas.

In the dry etching method of the present disclosure, preferably, the first etching gas and the second etching gas each independently further contain at least one inert gas selected from the group consisting of $N_2$, Ar, He, Ne, and Kr.

The dry etching method of the present disclosure preferably further includes a preprocessing step of supplying a reducing gas to the metal film before the first etching step.

A method of producing a semiconductor device of the present disclosure includes a step of etching a metal film on a substrate by the dry etching method of the present disclosure.

An etching device of the present disclosure includes: a placement unit which is provided in a processing container capable of being heated and on which a workpiece with a metal film formed on a surface thereof is to be placed; a first β-diketone supply unit configured to supply a first β-diketone to the workpiece, the first β-diketone being a compound capable of forming a first complex through a reaction with the metal film; a second β-diketone supply unit configured to supply a second β-diketone to the workpiece, the second β-diketone being a compound capable of forming a second complex having a lower sublimation point than the first complex through a reaction with the metal film; and a controller configured to output a control signal for performing a first step of supplying a first etching gas containing the first β-diketone to the workpiece and a second step of supplying a second etching gas containing the second β-diketone to the workpiece after the first step.

The etching device of the present disclosure preferably further includes a reducing gas supply unit configured to supply a reducing gas to the workpiece, wherein the controller is configured to output a control signal for supplying the reducing gas to the workpiece before supply of the first etching gas to the workpiece.

Advantageous Effects of Invention

The present disclosure can provide a dry etching method capable of reducing or preventing surface roughness of a metal film.

DESCRIPTION OF EMBODIMENTS

Figure 1:
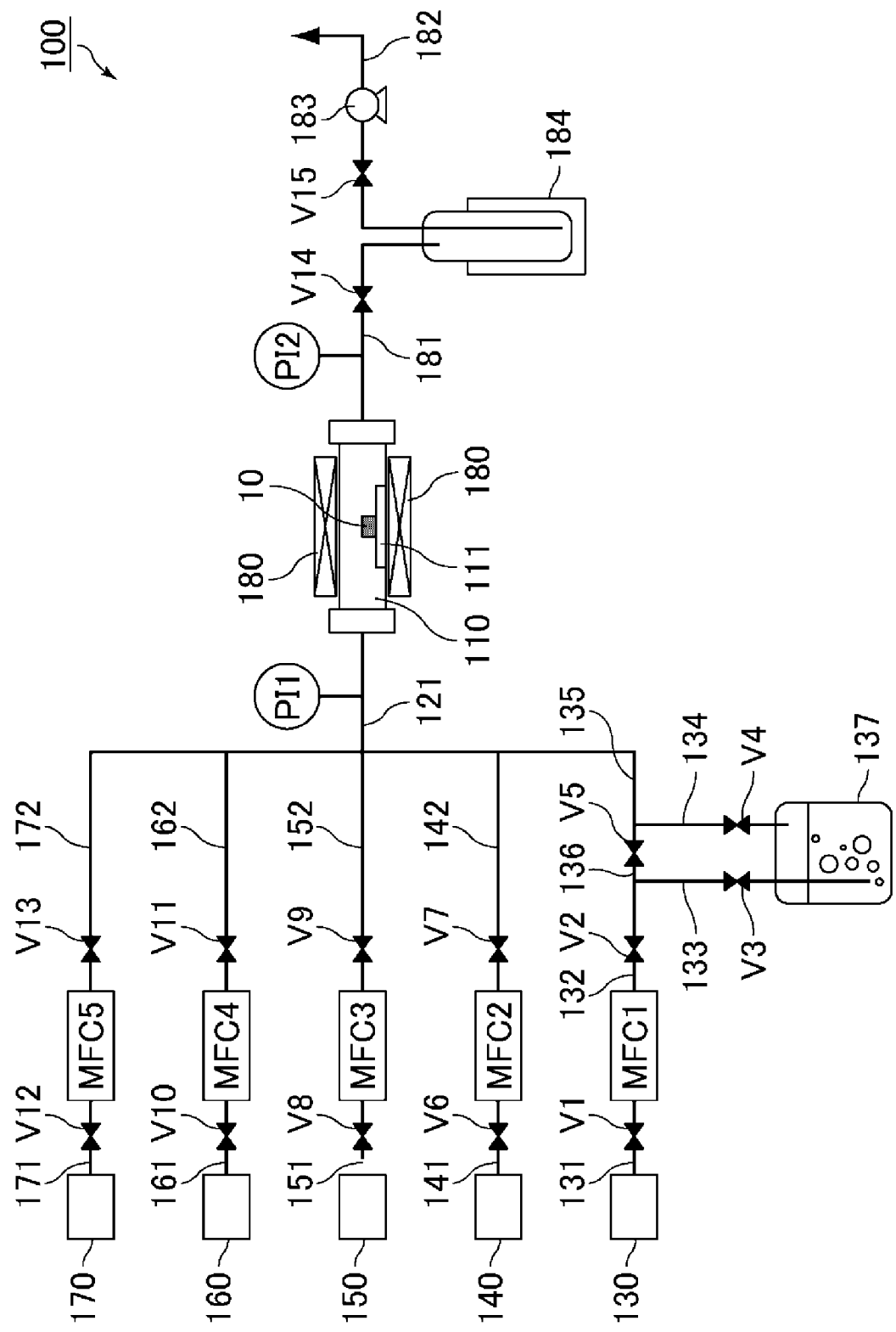
FIG. 1 is a schematic view showing an etching device according to one embodiment of the present invention.

Hereinafter, embodiments of the present invention are described in detail.

The present disclosure is not limited to the following embodiments, and can be modified as appropriate without changing the gist of the present disclosure.

[Dry Etching Method]

A dry etching method according to one embodiment of the present invention brings etching gases each containing a β-diketone into contact with a metal film formed on a surface of a workpiece. When a heated metal film is brought into contact with an etching gas containing a β-diketone, the β-diketone and the metal film react to form a complex. This complex has a high vapor pressure, and thus can remove the metal film when it evaporates.

The dry etching method according to one embodiment of the present invention includes a first etching step of bringing a first etching gas containing a first β-diketone, capable of forming a first complex having a high sublimation point, into contact with a metal film, followed by a second etching step of bringing a second etching gas containing a second β-diketone, capable of forming a second complex having a lower sublimation point than the first complex, into contact with the metal film.

The method therefore can reduce or prevent surface roughness of the metal film after the etching, seemingly based on the following mechanism. First, when the metal film is processed with the first β-diketone, the first β-diketone forms a complex preferentially in crystal grain boundaries where the bonding is relatively weak (i.e., the reactivity is high). When the metal film is then processed with the second β-diketone, the complex formed by the first β-diketone serves as a protective film for the crystal grain boundaries, and thus the second β-diketone attacks the crystal grains where the reactivity is relatively low. Thereafter, as the crystal grains are etched, the protected crystal grain boundaries are also etched. As a result, presumably, the metal film is entirely uniformly etched.

The metal film subjected to the dry etching method according to one embodiment of the present invention is formed of a metallic element capable of forming a complex with β-diketones. Specific examples thereof include at least one metallic element selected from the group consisting of Zr, Hf, Fe, Mn, Cr, Al, Ru, Co, Cu, Zn, Pt, and Ni. The metal film may be formed of one metallic element or a plurality of metallic elements. In particular, the dry etching method according to one embodiment of the present invention is effective for a metal film containing a cobalt element (Co). In the dry etching method according to one embodiment of the present invention, the base material of the workpiece can be a substrate such as a known semiconductor substrate or a known glass substrate.

(First Etching Step)

The first etching gas contains a first β-diketone. The first β-diketone used is determined depending on the second β-diketone used and is not limited. For example, the first β-diketone may be acetylacetone or trifluoroacetylacetone. One compound or two or more compounds may be used for the first β-diketone.

The first etching gas has a first β-diketone content of preferably 10% by volume or more and 90% by volume or less, more preferably 30% by volume or more and 60% by volume or less, in order to achieve a sufficient etching rate.

The first etching gas preferably further contains at least one additive gas selected from the group consisting of NO, $NO_2$, $N_2O$, $O_2$, $O_3$, $H_2O$, and $H_2O_2$.

When the first etching gas contains an additive gas, the first etching gas has an additive gas content of preferably 0.01% by volume or more and 10% by volume or less, more preferably 0.05% by volume or more and 8% by volume or less, still more preferably 0.1% by volume or more and 5% by volume or less, in order to achieve a sufficient etching rate.

The first etching gas preferably further contains at least one inert gas selected from the group consisting of $N_2$, Ar, He, Ne, and Kr.

When the first etching gas contains an inert gas, the first etching gas has an inert gas content of preferably 1% by volume or more and 90% by volume or less, more preferably 10% by volume or more and 80% by volume or less, still more preferably 30% by volume or more and 50% by volume or less.

(Second Etching Step)

The second etching gas contains a second β-diketone. The second β-diketone used is determined depending on the first β-diketone used and is not limited. For example, the second β-diketone may be hexafluoroacetylacetone or trifluoroacetylacetone. One compound or two or more compounds may be used for the second β-diketone.

The combination of the first β-diketone and the second β-diketone (first β-diketone, second β-diketone) may be, for example, (acetylacetone, hexafluoroacetylacetone), (acetylacetone, trifluoroacetylacetone), or (trifluoroacetylacetone, hexafluoroacetylacetone).

The second etching gas has a second β-diketone content of preferably 10% by volume or more and 90% by volume or less, more preferably 30% by volume or more and 60% by volume or less, in order to achieve a sufficient etching rate.

The second etching gas preferably further contains at least one additive gas selected from the group consisting of NO, $NO_2$, $N_2O$, $O_2$, $O_3$, $H_2O$, and $H_2O_2$. When the first etching gas and the second etching gas each contain an additive gas, the additive gas contained in the first etching gas and the additive gas contained in the second etching gas may be the same as or different from each other.

When the second etching gas contains an additive gas, the second etching gas has an additive gas content of preferably 0.01% by volume or more and 10% by volume or less, more preferably 0.05% by volume or more and 8% by volume or less, still more preferably 0.1% by volume or more and 5% by volume or less, in order to achieve a sufficient etching rate. When the first etching gas and the second etching gas each contain an additive gas, the additive gas content in the first etching gas and the additive gas content in the second etching gas may be the same as or different from each other.

The second etching gas preferably further contains at least one inert gas selected from the group consisting of $N_2$, Ar, He, Ne, and Kr. When the first etching gas and the second etching gas each contain an inert gas, the inert gas contained in the first etching gas and the inert gas contained in the second etching gas may be the same as or different from each other.

When the second etching gas contains an inert gas, the second etching gas has an inert gas content of preferably 1% by volume or more and 90% by volume or less, more preferably 10% by volume or more and 80% by volume or less, still more preferably 30% by volume or more and 50% by volume or less. When the first etching gas and the second etching gas each contain an inert gas, the inert gas content in the first etching gas and the inert gas content in the second etching gas may be the same as or different from each other.

In the dry etching method according to one embodiment of the present invention, the first etching step and the second etching step may be repeated. In this case, the conditions of the first etching step may be the same or different each time. Similarly, the conditions of the second etching step may be the same or different each time.

(Preprocessing Step)

The dry etching method according to one embodiment of the present invention preferably further includes a preprocessing step of supplying a reducing gas to the metal film before the first etching step. For example, when the metal film to be removed contains a cobalt element, reducing the natural oxide film of cobalt can reduce the etching rate variation due to the thickness of the natural oxide film.

In the preprocessing step, the reducing gas can be, for example, hydrogen ($H_2$) gas, carbon monoxide (CO) gas, or formaldehyde (HCHO) gas. One reducing gas may be used or two or more reducing gasses may be used.

In the preprocessing step, a reducing gas such as $H_2$ gas alone may be supplied, or the reducing gas may be diluted with the above-described inert gas such as $N_2$ gas.

Also, in the preprocessing step, the β-diketones and the additive gases are preferably not supplied. Specifically, each of the proportions of the β-diketones and the additive gases in the total amount of the gases supplied in the preprocessing step is preferably less than 0.01% by volume, more preferably less than 0.001% by volume, particularly preferably 0% by volume.

[Etching Device]

The dry etching method according to one embodiment of the present invention can be performed, for example, with a common etching device used in a semiconductor production step. Such an etching device is also one embodiment of the present invention.

FIG. 1 is a schematic view showing an etching device according to one embodiment of the present invention.

An etching device 100 shown in FIG. 1 includes a processing container 110 in which a workpiece 10 with a metal film formed on a surface thereof is to be placed and components connected to the processing container 110, and heating units 180 that heat the processing container 110. The components connected to the processing container 110 are a first β-diketone supply unit 130 that supplies a first β-diketone; a second β-diketone supply unit 140 that supplies a second β-diketone; an additive gas supply unit 150 that supplies an additive gas; an inert gas supply unit 160 that supplies an inert gas; and a reducing gas supply unit 170 that supplies a reducing gas. A gas flow rate controller (not shown) is connected to components such as the first β-diketone supply unit 130 and outputs a valve control signal to supply gases such as the first β-diketone to the workpiece 10. The etching device 100 may not include the additive gas supply unit 150, the inert gas supply unit 160, and the reducing gas supply unit 170.

The processing container 110 includes a placement unit 111 on which the workpiece 10 is to be placed. The processing container 110 is not limited as long as the container is resistant to the β-diketones used and the pressure in the container can be reduced to a predetermined pressure. Usually, for example, a typical processing container installed in an etching device for semiconductors can be used. Also, the supply pipes for supplying etching gasses and the like and other pipes are not limited as long as they are resistant to β-diketones.

The first β-diketone supply unit 130 controls the amount of supply using valves V1 to V5 and a mass flow controller MFC1 to supply a bubbling gas such as $N_2$ from pipes 131, 132, and 133 to a first β-diketone vessel 137 and supply a first β-diketone from the first β-diketone vessel 137 to pipes 134, 135, and 121. Although the pipe 133 and the pipe 134 are connected via a pipe 136 in FIG. 1, the pipe 136 may not be provided.

The second β-diketone supply unit 140 controls the amount of supply using valves V6 and V7 and a mass flow controller MFC2 to supply a second β-diketone from pipes 141 and 142 to the pipe 121.

The additive gas supply unit 150 controls the amount of supply using valves V8 and V9 and a mass flow controller MFC3 to supply an additive gas from pipes 151 and 152 to the pipe 121.

The inert gas supply unit 160 controls the amount of supply using valves V10 and V11 and a mass flow controller MFC4 to supply an inert gas from pipes 161 and 162 to the pipe 121.

The reducing gas supply unit 170 controls the amount of supply using valves V12 and V13 and a mass flow controller MFC5 to supply a reducing gas from pipes 171 and 172 to the pipe 121.

In the etching device 100, preferably, the β-diketones are each diluted to a predetermined concentration with the inert gas supplied from the inert gas supply unit 160 and mixed with the additive gas supplied from the additive gas supply unit 150 at a predetermined ratio before being supplied to the processing container 110. Here, the β-diketones may not be diluted with the inert gas.

The heating units 180 which heat the processing container 110 are provided outside the processing container 110. A heater (not shown) may be provided inside the placement unit 111 as a second heating unit. When a plurality of placement units is installed in the processing container 110, each placement unit can be provided with a heater such that the placement units are set to the respective predetermined temperatures.

To one side of the processing container 110 is connected a gas exhauster that exhausts the reacted gasses. A vacuum pump 183 of the gas exhauster exhausts the reacted gasses from the processing container 110 through a pipe 181. The reacted gasses are collected by a liquid nitrogen trap 184 provided between the pipe 181 and a pipe 182. The pipes 181 and 182 can be respectively provided with valves V14 and V15 for pressure control. In FIG. 1, reference signs PI1 and PI2 each indicate a pressure indicator. Based on the pressure indicator readings, the controller can control the flow controllers and the valves.

The etching method is described in detail with reference to the etching device 100 as an example.

The workpiece 10, on which a metal film containing a metallic element capable of forming a complex with β-diketones is formed, is placed in the processing container 110. The vacuum pump 183 is used to evacuate the processing container 110, the pipe 121, the pipes 131 to 136, the pipes 141 and 142, the pipes 151 and 152, the pipes 161 and 162, the pipes 171 and 172, the liquid nitrogen trap 184, and the pipes 181 and 182 to a predetermined pressure, followed by heating of the workpiece 10 with the heating units 180.

When the temperature of the workpiece 10 reaches a predetermined temperature, the first β-diketone supply unit 130, the additive gas supply unit 150, and the inert gas supply unit 160 respectively supply the first β-diketone, the additive gas, and the inert gas to the pipe 121 at the respective predetermined flow rates.

The diluted first β-diketone and the additive gas are mixed in predetermined proportions and then supplied to the processing container 110. The pressure in the processing container 110 is controlled to a predetermined pressure while the resulting first etching gas is introduced into the processing container 110. The first etching gas and the metal film are reacted for a predetermined period of time for the first etching step. The first etching step enables non-plasma etching, and thus the etching requires no excitation of the etching gas in the plasma or the like.

After completion of the first etching step, the components are evacuated again. Then, the second β-diketone supply unit 140, the additive gas supply unit 150, and the inert gas supply unit 160 respectively supply the second β-diketone, the additive gas, and the inert gas to the pipe 121 at the respective predetermined flow rates.

The diluted second β-diketone and the additive gas are mixed in predetermined proportions and then supplied to the processing container 110. The pressure in the processing container 110 is controlled to a predetermined pressure while the resulting second etching gas is introduced into the processing container 110. The second etching gas and the metal film are reacted for a predetermined period of time for the second etching step. The second etching step enables non-plasma etching, and thus the etching requires no plasma excitation of the etching gas or the like.

When the first etching step and the second etching step are repeated, the components are evacuated again after completion of the second etching step. Thereafter, the first etching step and the second etching step are performed as above.

After completion of the second etching step, heating with the heating units 180 is stopped to drop the temperature and the vacuum pump 183 is stopped to release the vacuum. Thereby, the metal film is etched.

Before the first etching step, the preprocessing step can be performed by supplying a reducing gas from the reducing gas supply unit 170 to the workpiece 10. After the preprocessing step, the components are preferably evacuated before the first etching step.

(Etching Conditions)

In the dry etching method according to one embodiment of the present invention, the first etching step and the second etching step may each be performed at any temperature at which the complex is evaporable. In particular, the temperature of the metal film to be removed is preferably 100° C. or higher and 350° C. or lower, more preferably 130° C. or higher and 250° C. or lower. The temperature of the metal film in the first etching step may be the same as or different from that in the second etching step.

The pressure in the processing container during each of the first etching step and the second etching step is not limited and is usually in a pressure range of 0.1 kPa or more and 101.3 kPa or less. The pressure in the processing container during the first etching step may be the same as or different from that during the second etching step.

In particular, when the metal film to be removed contains a cobalt element, the first etching gas contains acetylacetone as the first β-diketone and NO as an additive gas, and the second etching gas contains hexafluoroacetylacetone as the second β-diketone and NO as an additive gas, etching at a high temperature of about 300° C. to 400° C. may decompose hexafluoroacetylacetone to form a carbon film or may damage the structure of the workpiece. Thus, the workpiece is preferably heated to 250° C. or lower.

Within the above temperature range, the pressure in the processing container during the first etching step is preferably 20 Torr or more and 300 Torr or less (2.67 kPa or more and 39.9 kPa or less), more preferably 20 Torr or more and 100 Torr or less (2.67 kPa or more and 13.3 kPa or less), still more preferably 20 Torr or more and 50 Torr or less (2.67 kPa or more and 6.67 kPa or less), in order to achieve a sufficient etching rate. Also, the pressure in the processing container during the second etching step is preferably 20 Torr or more and 300 Torr or less (2.67 kPa or more and 39.9 kPa or less), more preferably 50 Torr or more and 250 Torr or less (6.67 kPa or more and 33.3 kPa or less), still more preferably 100 Torr or more and 200 Torr or less (13.3 kPa or more and 26.7 kPa or less).

The processing time for each of the first etching step and the second etching step is not limited, and is preferably within 60 minutes in consideration of the efficiency of the semiconductor device production process. Here, the processing time for each etching step refers to the time from introduction of an etching gas to the processing container in which the workpiece is placed to exhaustion of the etching gas in the processing container with a vacuum pump or the like for termination of the etching process.

When the preprocessing step is performed, the processing temperature in the preprocessing step may be any temperature at which the natural oxide film is reducible. The reduction reaction hardly proceeds at a low processing temperature in the preprocessing step. Also, the processing temperature in the preprocessing step may be high, but is preferably the same as the processing temperature in the first etching step in terms of operation of the etching device. Thus, in the preprocessing step, the workpiece is preferably heated to 100° C. or higher and 350° C. or lower, more preferably 150° C. or higher and 250° C. or lower.

In the preprocessing step, the flow rate of the reducing gas depends on the capacity of the processing container. In the preprocessing step, the pressure in the processing container is not limited, and may be set appropriately to suit the device within the range of 10 to 500 Torr (1.33 to 66.5 kPa), for example.

The processing time for the preprocessing step may be set appropriately depending on the conditions such as the film formation method of the metal film formed on the substrate.

[Method of Producing Semiconductor Device]

The dry etching method according to one embodiment of the present invention is usable as an etching method for formation of a predetermined pattern on a metal film in a conventional semiconductor device. Etching a metal film on a substrate by the dry etching method according to one embodiment of the present invention enables inexpensive production of a semiconductor device.

Examples of such a semiconductor device include solar cells, hard disk drives, dynamic random access memories, phase-change memories, ferroelectric random access memories, magnetoresistive random access memories, resistive random access memories, and micro electro mechanical systems (MEMS).

EXAMPLES

Hereinafter, examples that specifically disclose the present disclosure are described. The present disclosure is not limited to these examples.

In each of Example 1, Example 2, and Comparative Example 1, the etching device 100 shown in FIG. 1 was used to etch a cobalt film (shape: 1 cm×1 cm, film thickness: 200 nm) formed on the surface of a silicon wafer.

Figure 2:
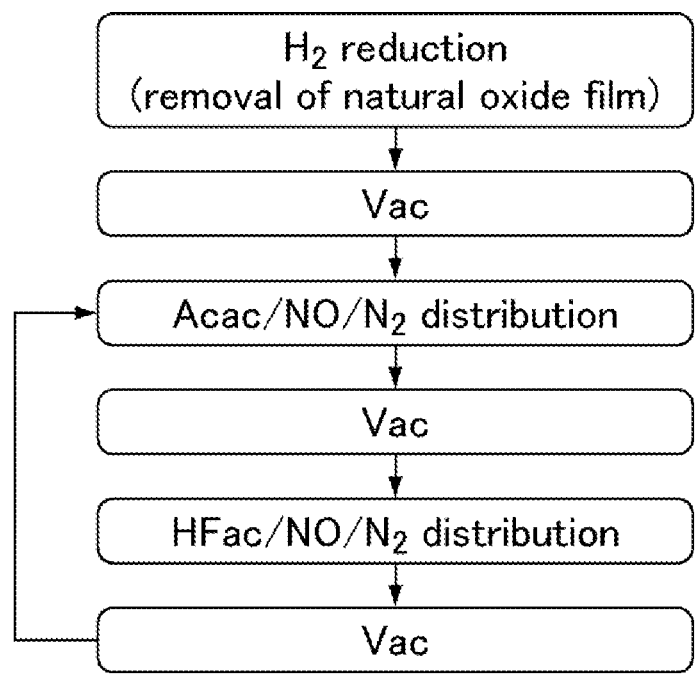
FIG. 2 is a flowchart showing the test procedure in Example 1 and Example 2.
Figure 3:
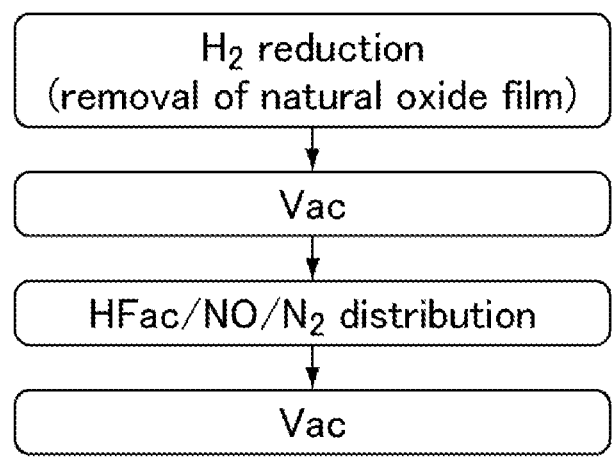
FIG. 3 is a flowchart showing the test procedure in Comparative Example 1.

FIG. 2 is a flowchart showing the test procedure in Example 1 and Example 2. FIG. 3 is a flowchart showing the test procedure in Comparative Example 1. In FIG. 2 and FIG. 3, Vac indicates evacuation.

Example 1

The processing container 110, the pipe 121, the pipes 131 to 136, the pipes 141 and 142, the pipes 151 and 152, the pipes 161 and 162, the pipes 171 and 172, the liquid nitrogen trap 184, and the pipes 181 and 182 were evacuated to lower than 10 Pa. Then, the workpiece 10 which has been weighed and placed on the placement unit 111 was heated with the heating units 180 and the heater installed in the placement unit 111. After confirmation that the heating units 180 and the heater installed in the placement unit 111 reached 200° C., the preprocessing step was performed by supplying $H_2$ gas from the reducing gas supply unit 170 at 10 sccm under a pressure of 50 Torr for 10 minutes.

After completion of the preprocessing step, the components were evacuated again to lower than 10 Pa. Then, the first etching step was performed by controlling the pressure in the processing container 110 to 21 Torr while supplying acetylacetone (Acac) from the first β-diketone supply unit 130, NO gas from the additive gas supply unit 150, and $N_2$ gas from the inert gas supply unit 160 to the pipe 121 at the respective predetermined flow rates to introduce the first etching gas to the processing container 110. The temperature of the workpiece was 200° C., and the flow rate of the first etching gas was Acac/NO/$N_2$=10/1/10 sccm. After 1 to 5 minutes from the start of introduction of the first etching gas, the introduction of the first etching gas was stopped.

After completion of the first etching step, the components were evacuated again to lower than 10 Pa. Then, the second etching step was performed by controlling the pressure in the processing container 110 to 100 Torr while supplying hexafluoroacetylacetone (HFAc) from the second β-diketone supply unit 140, NO gas from the additive gas supply unit 150, and $N_2$ gas from the inert gas supply unit 160 to the pipe 121 at the respective predetermined flow rates to introduce the second etching gas to the processing container 110. The temperature of the workpiece was 200° C., and the flow rate of the second etching gas was HFAc/NO/$N_2$=50/1/49 sccm. After 1 to 5 minutes from the start of introduction of the second etching gas, the introduction of the second etching gas was stopped.

The first etching step and the second etching step were repeated for 1 to 8 cycles.

Example 2

The workpiece was etched by performing the preprocessing step, the first etching step, and the second etching step as in Example 1, except that the temperature of the workpiece was changed to 150° C.

Comparative Example 1

First, the preprocessing step was performed under the same conditions as in Example 1.

After completion of the preprocessing step, the components were evacuated again to lower than 10 Pa. Then, an etching step was performed by controlling the pressure in the processing container 110 to 100 Torr while supplying hexafluoroacetylacetone (HFAc) from the second β-diketone supply unit 140, NO gas from the additive gas supply unit 150, and $N_2$ gas from the inert gas supply unit 160 to the pipe 121 at the respective predetermined flow rates to introduce an etching gas to the processing container 110. The temperature of the workpiece was 200° C., and the flow rate of the etching gas was HFAc/NO/$N_2$=50/1/49 sccm. After 2 to 60 minutes from the start of introduction of the etching gas, the introduction of the etching gas was stopped.

In each of Example 3 and Comparative Example 2, the etching device 100 shown in FIG. 1 was used to etch an iron film (shape: 1 cm×1 cm, film thickness: 200 nm) formed on the surface of a silicon wafer.

Example 3

First, the preprocessing step was performed under the same conditions as in Example 1.

After completion of the preprocessing step, the components were evacuated again to lower than 10 Pa. Then, the first etching step was performed by controlling the pressure in the processing container 110 to 21 Torr while supplying acetylacetone (Acac) from the first β-diketone supply unit 130, $H_2O$ gas from the additive gas supply unit 150, and $N_2$ gas from the inert gas supply unit 160 to the pipe 121 at the respective predetermined flow rates to introduce the first etching gas to the processing container 110. The temperature of the workpiece was 250° C., and the flow rate of the first etching gas was Acac/$H_2O$/$N_2$=10/1/10 sccm. After 1 to 5 minutes from the start of introduction of the first etching gas, the introduction of the first etching gas was stopped.

After completion of the first etching step, the components were evacuated again to lower than 10 Pa. Then, the second etching step was performed by controlling the pressure in the processing container 110 to 100 Torr while supplying hexafluoroacetylacetone (HFAc) from the second β-diketone supply unit 140, $H_2O$ gas from the additive gas supply unit 150, and $N_2$ gas from the inert gas supply unit 160 to the pipe 121 at the respective predetermined flow rates to introduce the second etching gas to the processing container 110. The temperature of the workpiece was 250° C., and the flow rate of the second etching gas was HFAc/$H_2O$/$N_2$=50/1/49 sccm. After 1 to 5 minutes from the start of introduction of the second etching gas, the introduction of the second etching gas was stopped.

The first etching step and the second etching step were repeated for 1 to 8 cycles.

Comparative Example 2

First, the preprocessing step was performed under the same conditions as in Example 1.

After completion of the preprocessing step, the components were evacuated again to lower than 10 Pa. Then, an etching step was performed by controlling the pressure in the processing container 110 to 100 Torr while supplying hexafluoroacetylacetone (HFAc) from the second β-diketone supply unit 140, $H_2O$ gas from the additive gas supply unit 150, and $N_2$ gas from the inert gas supply unit 160 to the pipe 121 at the respective predetermined flow rates to introduce an etching gas to the processing container 110. The temperature of the workpiece was 250° C., and the flow rate of the etching gas was HFAc/$H_2O$/$N_2$=50/1/49 sccm. After 2 to 60 minutes from the start of introduction of the etching gas, the introduction of the etching gas was stopped.

In each of Example 4 and Comparative Example 3, the etching device 100 shown in FIG. 1 was used to etch a hafnium film (shape: 1 cm×1 cm, film thickness: 200 nm) formed on the surface of a silicon wafer.

Example 4

First, the preprocessing step was performed under the same conditions as in Example 1.

After completion of the preprocessing step, the components were evacuated again to lower than 10 Pa. Then, the first etching step was performed by controlling the pressure in the processing container 110 to 21 Torr while supplying acetylacetone (Acac) from the first β-diketone supply unit 130, $NO_2$ gas from the additive gas supply unit 150, and $N_2$ gas from the inert gas supply unit 160 to the pipe 121 at the respective predetermined flow rates to introduce the first etching gas to the processing container 110. The temperature of the workpiece was 300° C., and the flow rate of the first etching gas was Acac/$NO_2$/$N_2$=10/1/10 sccm. After 1 to 5 minutes from the start of introduction of the first etching gas, the introduction of the first etching gas was stopped.

After completion of the first etching step, the components were evacuated again to lower than 10 Pa. Then, the second etching step was performed by controlling the pressure in the processing container 110 to 100 Torr while supplying hexafluoroacetylacetone (HFAc) from the second β-diketone supply unit 140, $NO_2$ gas from the additive gas supply unit 150, and $N_2$ gas from the inert gas supply unit 160 to the pipe 121 at the respective predetermined flow rates to introduce the second etching gas to the processing container 110. The temperature of the workpiece was 300° C., and the flow rate of the second etching gas was HFAc/$NO_2$/$N_2$=50/1/49 sccm. After 1 to 5 minutes from the start of introduction of the second etching gas, the introduction of the second etching gas was stopped.

The first etching step and the second etching step were repeated for 1 to 8 cycles.

Comparative Example 3

First, the preprocessing step was performed under the same conditions as in Example 1.

After completion of the preprocessing step, the components were evacuated again to lower than 10 Pa. Then, an etching step was performed by controlling the pressure in the processing container 110 to 100 Torr while supplying hexafluoroacetylacetone (HFAc) from the second β-diketone supply unit 140, $NO_2$ gas from the additive gas supply unit 150, and $N_2$ gas from the inert gas supply unit 160 to the pipe 121 at the respective predetermined flow rates to introduce an etching gas to the processing container 110. The temperature of the workpiece was 300° C., and the flow rate of the etching gas was HFAc/$NO_2$/$N_2$=50/1/49 sccm. After 2 to 60 minutes from the start of introduction of the etching gas, the introduction of the etching gas was stopped.

In each of Example 1 to Example 4 and Comparative Example 1 to Comparative Example 3, the workpiece 10 taken out of the processing container 110 was weighed after release of the vacuum in the processing container 110. The volume of the workpiece 10 was calculated from the change in weight of the workpiece 10 before and after the test and the density of the cobalt film, iron film, or hafnium film. The etching amount was calculated by dividing the calculated volume by the area of the cobalt film, iron film, or hafnium film.

In each of Example 1 to Example 4 and Comparative Example 1 to Comparative Example 3, the unevenness of the surface of the cobalt film, iron film, or hafnium film after the etching was determined with AFM (available from Shimadzu Corporation, model: SPM-9700). The root mean square (RMS) roughness of the value measured with the AFM was determined and used as an index of surface roughness.

The etching conditions in each of Example 1 to Example 4 and Comparative Example 1 to Comparative Example 3 are shown in Table 1. In addition, the slopes of RMS against etching amount are shown in Table 1.

TABLE 1

| | Etched film | First β-diketone | Second β-diketone | Additive gas | Temperature (° C.) | RMS/etching amount (slope) |
|---|---|---|---|---|---|---|
| Example 1 | Co | Acac | HFAc | NO | 200 | 0.063 |
| Example 2 | Co | Acac | HFAc | NO | 150 | 0.058 |
| Example 3 | Fe | Acac | HFAc | $H_2O$ | 250 | 0.082 |
| Example 4 | Hf | Acac | HFAc | $NO_2$ | 300 | 0.076 |
| Comparative Example 1 | Co | None | HFAc | NO | 200 | 0.095 |
| Comparative Example 2 | Fe | | HFAc | $H_2O$ | 250 | 0.102 |
| Comparative Example 3 | Hf | | HFAc | $NO_2$ | 300 | 0.113 |

Figure 4:
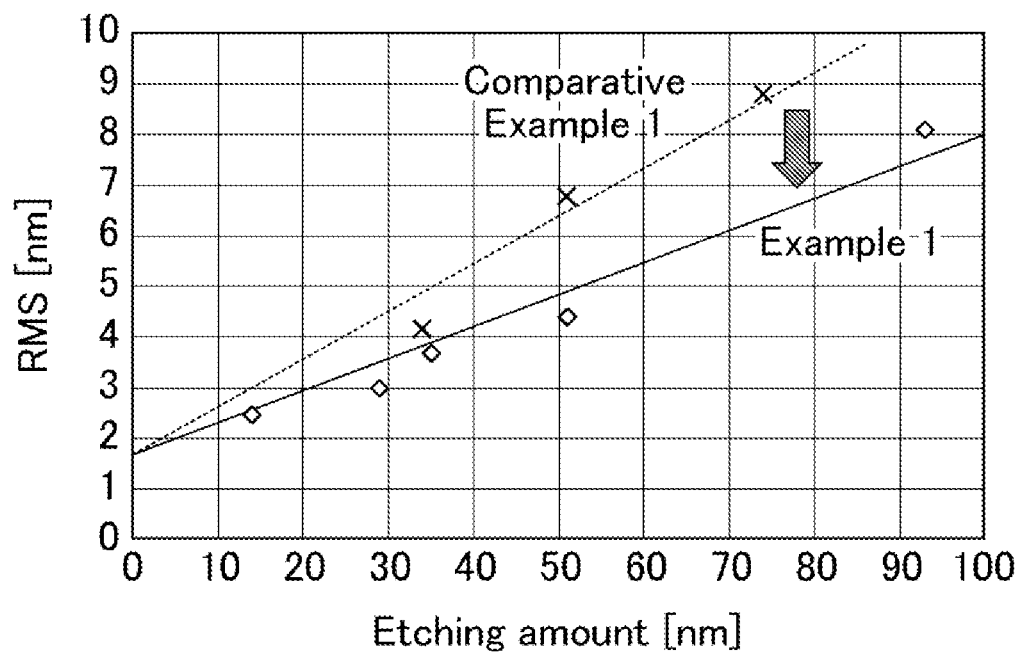
FIG. 4 is a graph of RMS vs. etching amount in Example 1 and Comparative Example 1.

FIG. 4 is a graph of RMS vs. etching amount in Example 1 and Comparative Example 1.

FIG. 4 shows that the slope of RMS against etching amount was 0.095 in Comparative Example 1 while it decreased to 0.063 in Example 1. The results in FIG. 4 confirm that the surface roughness after the etching was reduced in Example 1.

Figure 5:
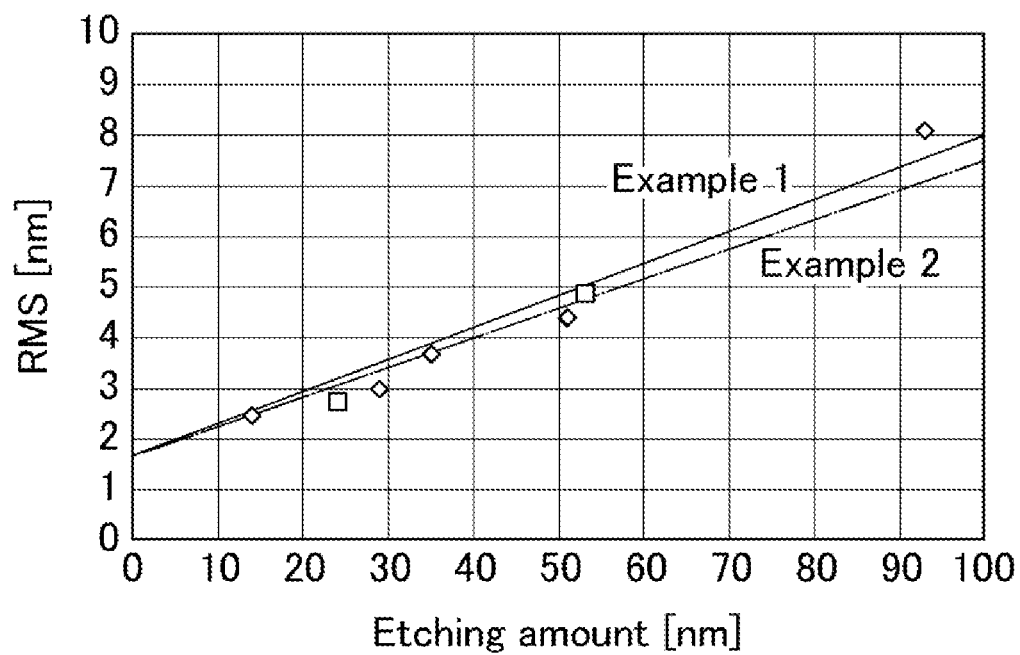
FIG. 5 is a graph of RMS vs. etching amount in Example 1 and Example 2.

FIG. 5 is a graph of RMS vs. etching amount in Example 1 and Example 2.

FIG. 5 shows that the slope of RMS against etching amount was 0.063 in Example 1 with an etching temperature of 200° C., while it was 0.058 in Example 2 with an etching temperature of 150° C. The results in FIG. 5 confirm that the slopes hardly depend on the temperature. Seemingly, since the decrease in the etching temperature causes a decrease in the etching rate both in the first etching step and the second etching step, the difference in etching rate is maintained.

As shown in Table 1, when the etched film was an iron film, the slope was 0.102 in Comparative Example 2, while it decreased to 0.082 in Example 3. Similarly, when the etched film was a hafnium film, the slope was 0.113 in Comparative Example 3, while it decreased to 0.076 in Example 4. These results confirm that the surface roughness after the etching was reduced also in Example 3 and Example 4.

The above results suggest that the etching proceeds based on the presumed mechanism above.

The present application claims priority to Japanese Patent Application No. 2019-037591 filed on Mar. 1, 2019 under the Paris Convention and provisions of national law in a designated State. The disclosure of the application is hereby incorporated by reference in its entirety.

REFERENCE SIGNS LIST workpiece
100 etching device
110 processing container
111 placement unit
130 first β-diketone supply unit
131, 132, 133, 134, 135, 136 pipe
137 first β-diketone container
140 second β-diketone supply unit
141, 142 pipe
150 additive gas supply unit
151, 152 pipe
160 inert gas supply unit
161, 162 pipe
170 reducing gas supply unit
171, 172 pipe
180 heating unit
181, 182 pipe
183 vacuum pump
184 liquid nitrogen trap
MFC1, MFC2, MFC3, MFC4, MFC5 mass flow controller
PI1, PI2 pressure indicator
V1, V2, V3, V4, V5, V6, V7, V8, V9, V10, V11, V12, V13, V14, V15 valve

The invention claimed is:

1. A dry etching method that etches a metal film formed on a surface of a workpiece by bringing etching gases each containing a β-diketone into contact with the metal film, the method comprising:
  a first etching step of bringing a first etching gas containing a first β-diketone into contact with the metal film; and
  a second etching step of bringing a second etching gas containing a second β-diketone into contact with the metal film after the first etching step,
  the first β-diketone being a compound capable of forming a first complex through a reaction with the metal film,
  the second β-diketone being a compound capable of forming a second complex having a lower sublimation point than the first complex through a reaction with the metal film,
  wherein the first etching gas and the second etching gas each independently further contain at least one additive gas selected from the group consisting of NO, $NO_2$, $N_2O$, $O_2$, $O_3$, $H_2O$, and $H_2O_2$.

2. The dry etching method according to claim 1,
  wherein a combination of the first β-diketone and the second β-diketone (first β-diketone, second β-diketone) is (acetylacetone, hexafluoroacetylacetone), (acetylacetone, trifluoroacetylacetone), or (trifluoroacetylacetone, hexafluoroacetylacetone).

3. The dry etching method according to claim 1,
  wherein the first etching step and the second etching step are repeated.

4. The dry etching method according to claim 1,
  wherein the metal film contains at least one metallic element selected from the group consisting of Zr, Hf, Fe, Mn, Cr, Al, Ru, Co, Cu, Zn, Pt, and Ni.

5. The dry etching method according to claim 1,
  wherein the metal film contains a cobalt element,
  the first etching gas contains acetylacetone as the first β-diketone and NO as the additive gas, and
  the second etching gas contains hexafluoroacetylacetone as the second β-diketone and NO as the additive gas.

6. The dry etching method according to claim 1,
  wherein the first etching gas and the second etching gas each independently further contain at least one inert gas selected from the group consisting of $N_2$, Ar, He, Ne, and Kr.

7. The dry etching method according to claim 1, further comprising a preprocessing step of supplying a reducing gas to the metal film before the first etching step.

8. A method of producing a semiconductor device, comprising
a step of etching a metal film on a substrate by the dry etching method according to claim 1.

9. The dry etching method according to claim 1,
wherein the first etching gas has the additive gas content of 0.01% by volume or more and 10% by volume or less.

10. The dry etching method according to claim 1,
wherein the first etching gas has the additive gas content of 0.05% by volume or more and 8% by volume or less.

11. The dry etching method according to claim 1,
wherein the first etching gas has the additive gas content of 0.1% by volume or more and 5% by volume or less.

12. The dry etching method according to claim 1,
wherein the first β-diketone is supplied from a first β-diketone supply unit in the first etching step, and the second β-diketone is supplied from a second β-diketone supply unit in the second etching step.

\* \* \* \* \*